United States Patent
Zhang et al.

(10) Patent No.: US 11,876,124 B2
(45) Date of Patent: Jan. 16, 2024

(54) VERTICAL TRANSISTOR HAVING AN OXYGEN-BLOCKING LAYER

(71) Applicant: International Business Machines Corporation, Armonk, NY (US)

(72) Inventors: Chen Zhang, Albany, NY (US); Christopher J. Waskiewicz, Rexford, NY (US); Shahab Siddiqui, Clifton Park, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/811,129

(22) Filed: Jul. 7, 2022

(65) Prior Publication Data
US 2022/0336627 A1 Oct. 20, 2022

Related U.S. Application Data (62) Division of application No. 16/910,296, filed on Jun. 24, 2020, now Pat. No. 11,476,346.

(51) Int. Cl.
*H01L 29/66* (2006.01)
*H01L 29/78* (2006.01)
*H01L 29/06* (2006.01)

(52) U.S. Cl.
CPC ...... *H01L 29/6656* (2013.01); *H01L 29/0653* (2013.01); *H01L 29/66666* (2013.01); *H01L 29/7827* (2013.01)

(58) Field of Classification Search
CPC .................. H01L 29/66666; H01L 29/7827
See application file for complete search history.

(56) References Cited

U.S. PATENT DOCUMENTS

| | | | |
|---|---|---|---|
| 5,016,081 A | 5/1991 | Brown et al. | |
| 6,770,534 B2 | 8/2004 | Cho et al. | |
| 7,683,428 B2 | 3/2010 | Chidambarrao et al. | |
| 11,476,346 B2 * | 10/2022 | Zhang | ............. H01L 29/7827 |
| 2006/0261406 A1 | 11/2006 | Chen | |
| 2018/0331101 A1 | 11/2018 | Anderson et al. | |
| 2019/0172924 A1 | 6/2019 | Jagannathan et al. | |
| 2019/0267325 A1 | 8/2019 | Lee et al. | |
| 2019/0326410 A1 | 10/2019 | Ando et al. | |
| 2021/0408261 A1 | 12/2021 | Zhang et al. | |

OTHER PUBLICATIONS

Anonymous, "Method for Providing Vertical Transistor FET (VTFET) Diffusion Path Block through BEOL Via," IPCOM000257934D, Mar. 2019, 3 pages.
List of IBM Patents or Patent Applications Treated as Related; Date Filed: Jul. 7, 2022, 2 pages.

* cited by examiner

*Primary Examiner* — Mark V Prenty
(74) *Attorney, Agent, or Firm* — Cantor Colburn LLP; Anthony Mauricio Pallone

(57) ABSTRACT

Embodiments of the invention are directed to a semiconductor device that includes a channel fin; a trench adjacent to an upper region of the channel fin; and an oxygen-blocking layer within the trench. The oxygen-blocking layer includes an oxygen gettering material configured to remove oxygen from an environment to which the oxygen-blocking layer is exposed.

20 Claims, 6 Drawing Sheets

FIG. 11

VERTICAL TRANSISTOR HAVING AN OXYGEN-BLOCKING LAYER

BACKGROUND

The present invention relates in general to semiconductor devices and their fabrication. More specifically, the present invention relates to improved fabrication methodologies and resulting structures for vertical field effect transistors (VFETs) configured and arranged to provide an oxygen-blocking (or oxygen-absorbing) layer that prevents oxygen diffusion into the VFET channel.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional geometry for MOSTFETs is known as a planar device geometry in which the various parts of the MOSFET device are laid down as planes or layers.

A type of MOSFET is a non-planar FET known generally as a VFET. VFETs employ semiconductor fins and sidegates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

Embodiments of the invention are directed to a semiconductor device that includes a channel fin; a trench adjacent to an upper region of the channel fin; and an oxygen-blocking layer within the trench. The oxygen-blocking layer includes an oxygen gettering material configured to remove oxygen from an environment to which the oxygen-blocking layer is exposed.

Embodiments of the invention are directed to a semiconductor device that includes a channel fin over a substrate; a trench adjacent to an upper region of the channel fin; an oxygen-blocking layer within a first portion of the trench; and a doped source or drain (S/D) region within a second portion of the trench. The oxygen-blocking layer includes an oxygen gettering material configured to remove oxygen from an environment to which the oxygen-blocking layer is exposed.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 1-11 depict cross-sectional views of a semiconductor structure showing the results of fabrication operations of a method for forming a final VFET semiconductor device having an oxygen-blocking bottom top spacer in accordance with aspects of the invention, in which:

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed, where it is desired to provide an oxygen-blocking spacer that prevents oxygen diffusion into the transistor channel.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. A bottom junction is formed at the interface between the channel fin and the bottom S/D region, and a top junction is formed at the interface between the channel fin and the top S/D region. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

In known VFET fabrication operations, the gate stack (i.e., the gate metal and the gate oxide) are formed then recessed to expose a top portion of the channel fin. A top spacer is then deposited adjacent to the exposed channel fin. Known top spacer deposition processes expose the exposed portions of the channel fin to oxygen, which can lead to re-growth of oxygen-containing layers of the gate oxide that was removed from the channel fin. For example, where the channel fin is silicon, exposing the silicon channel fin to oxygen can result in oxygen reacting with the silicon to form a layer of silicon oxide on the channel fin. Re-growth of the oxygen-containing layers of the gate oxide that were removed from the channel fin negatively impacts inversion layer thickness ($T_{inv}$) at the oxide/fin interface. Reducing $T_{inv}$ assists with achieving desired performance characteristics in conventional VFET designs.

Turning now to an overview of aspects of the invention, embodiments of the invention provide improved fabrication methodologies and resulting structures for VFETs having an oxygen-blocking (or oxygen-absorbing) layer. In embodiments of the invention, the oxygen-blocking layer can be implemented as a top spacer having formed thereon an oxygen blocking layer that prevents oxygen diffusion into the VFET channel. In embodiments of the invention, the oxygen-blocking layer is formed prior to forming the top spacer. In embodiments of the invention, the process used to form the top spacer exposes the VFET structure to oxygen that is present in a chamber used to execute the deposition process. In accordance with aspects of the invention, the oxygen-blocking layer blocks oxygen used in the top spacer deposition processes from reaching the VFET structure that is under-fabrication. More specifically, in accordance with aspects of the invention, the oxygen-blocking layer blocks oxygen used in the top spacer deposition processes from reaching portions of the channel fin that have been exposed during the VFET fabrication process. Accordingly, embodiments of the invention prevent re-growth of oxygen containing layers of a gate dielectric/oxide that was removed from the channel fin during the VFET fabrication process. For example, where the channel fin is silicon, embodiments of the invention prevent the silicon channel fin from reacting with oxygen to form a layer of silicon oxide on the channel fin. Without benefit of aspects of the invention, re-growth of oxygen-containing layers of the gate dielectric/oxide that were removed from the channel fin would negatively impact inversion layer thickness ($T_{inv}$) at the interface between the gate dielectric/oxide and the channel fin. Reducing $T_{inv}$ assists with achieving desired performance characteristics in conventional VFET designs.

In embodiments of the invention, the oxygen-blocking layer can be formed from an oxygen gathering or "gettering" material. In general, a "gettering" or "getter" material is a reactive material that exhibits the property of "getting" or scavenging another material. For example, an oxygen getter material exhibits the property of combining with nearby oxygen molecules chemically or by absorption, which removes oxygen from either the environment or from another material to which the oxygen getter material is communicatively coupled. Al is an example of an oxygen gettering material because Al is effective at gettering (i.e., reacting with and removing) oxygen that is present in either the environment or another material to which the Al is communicatively coupled. In embodiments of the invention, the oxygen-blocking layer can be formed from, or formed to include, an Al containing material.

Figure 1:
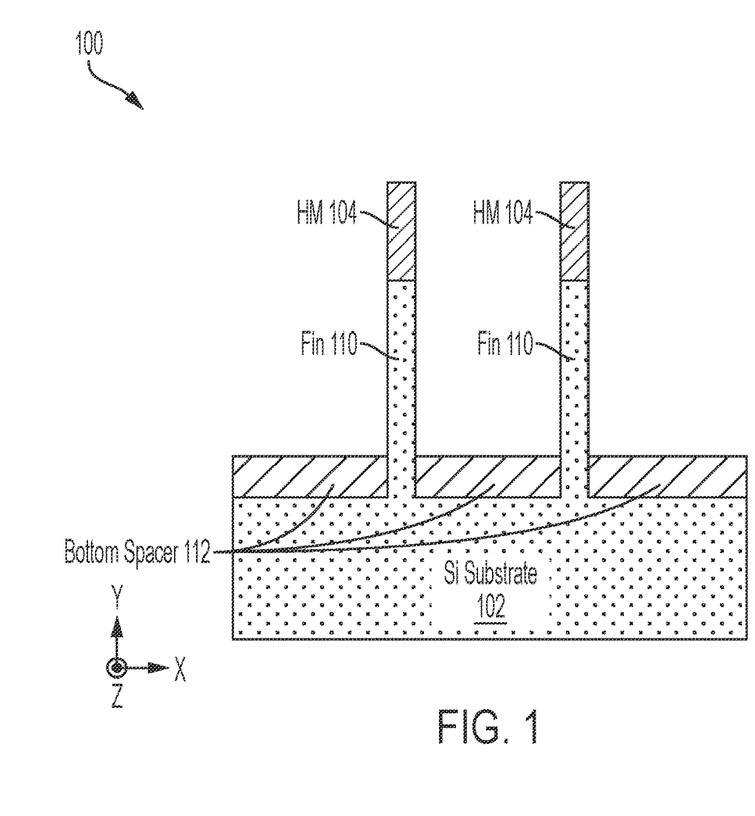
FIG. 1 depicts a cross-sectional view of the semiconductor structure after fabrication operations according to embodiments of the invention.

Turning now to a more detailed description of embodiments of the invention, FIGS. 1-11 depict two-dimensional (2D) cross-sectional views of a semiconductor structure 100 after fabrication operations according to embodiments of the invention. The fabrication operations depicted in FIGS. 1-11 are applied to the semiconductor structure 100 to form a final (or near final) VFET device 100A shown in FIG. 11. As shown in FIG. 1, known semiconductor fabrication operations have been used to form the semiconductor structure 100 having a substrate 102, channel fins 110, hard masks 104, and bottom spacers 112 across from a major surface of a substrate 102, configured and arranged as shown. With reference to the X/Y/Z diagram depicted in FIG. 1, the various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted in the 2D cross-sectional views shown in FIGS. 1-11, the various elements that form the semiconductor structure 100 and/or the final VFET device 100A (shown in FIG. 11) also extend along a third axis (e.g., Z-axis) perpendicular to the first axis and the second axis to define depth dimensions. In accordance with standard VFET architectures, the various elements of the semiconductor structures 100 and the VFET 100A (e.g., bottom spacers 112, gate oxide/dielectric 202 (shown in FIG. 2), gate meal structure 204 (shown in FIG. 2), and the like) extend completely around the sidewalls of the channel fins 110 in the X, Y, and Z directions.

The substrate 102 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 102 includes a buried oxide layer (not depicted). In some embodiments of the invention, the substrate 102 is doped to include bottom S/D regions (not shown separately from the substrate 102). In some embodiments of the invention, the bottom S/D region can be formed later in the fabrication process. In some embodiments of the invention, the bottom S/D region can be epitaxially grown, and the necessary doping to form the bottom S/D region is provided through in-situ doping during the epitaxial growth process, or through ion implantation. In some embodiments of the invention, the bottom S/D region can be doped using any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Continuing with FIG. 1, the channel fins 110 can be formed prior to formation of the bottom spacers 112 by depositing a hard mask layer (not shown) over the initial substrate 102 using any suitable deposition process. For example, the hard mask layer can be a dielectric such as silicon nitride (SiN), silicon oxide, or a combination of silicon oxide and silicon nitride. Conventional semiconductor device fabrication processes (e.g., patterning and lithography, self-aligned double patterning, self-aligned quadruple patterning) are used to remove portions of the initial substrate 102 and the hard mask layer to form the channel fins 110 and the hard masks 104. In some embodiments of the invention, the hard mask layer is patterned to expose portions of the initial substrate 102. The exposed portions of the initial substrate 102 can be removed or recessed using, for example, a wet etch, a dry etch, or a combination thereof, to thereby form the channel fins 110 and the hard masks 104. The channel fins 110 can be electrically isolated from other regions of the substrate 102 by a shallow trench isolation (not depicted). The shallow trench isolation can be formed from any suitable dielectric material (e.g., a silicon oxide material).

The bottom spacers 112 are formed over a major surface of the substrate 102. In embodiments of the invention where bottom doped S/D regions have been formed in the substrate 102, the bottom spacers 112 are formed across from the doped S/D regions and adjacent to bottom portions of the channel fins 110. The bottom spacers 112 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The bottom spacers 112 can be formed using known deposition processes, such as, for example, CVD, PECVD, ALD, PVD, chemical solution deposition, or other like processes.

Figure 2:
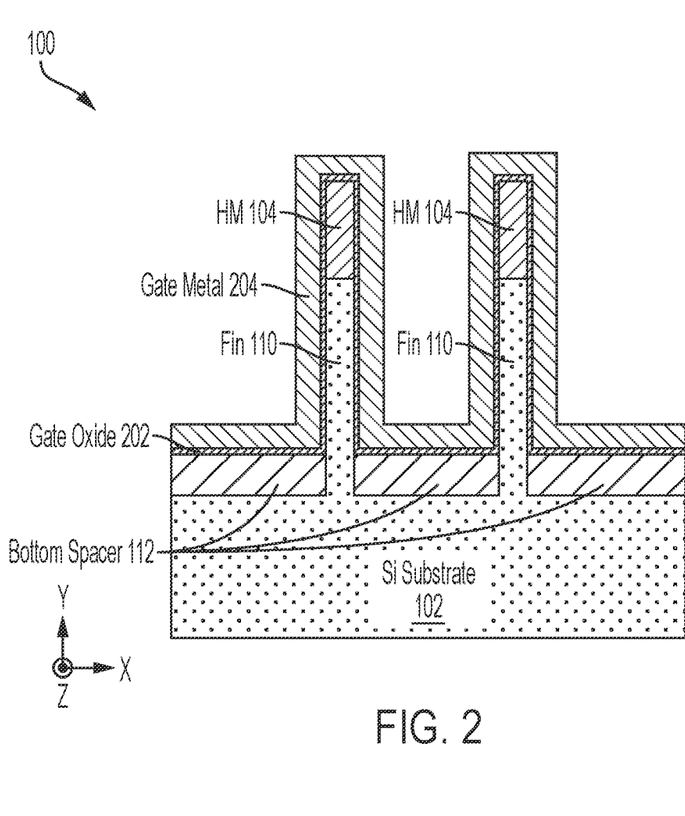
FIG. 2 depicts a cross-sectional view of the semiconductor structure after fabrication operations according to embodiments of the invention.

In FIG. 2, a gate dielectric 202 and a gate conductor/metal 204 (e.g., a work function metal (WFM)) have been deposited over the bottom spacers 112 and the channel fins 110. The gate dielectric 202 can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. The gate dielectric 202 can be of a composite structure having, for example, a first interlayer oxide layer (e.g., SiO, SiNO) and a second layer of high-k material. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, atomic layer deposition (ALD), evaporation, physical vapor deposition (PVD), chemical solution deposition, or other like processes. The thickness of the gate dielectric films can vary depending on the deposition process as well as the composition and number of high-k dielectric materials used.

The gate conductor 204 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the gate conductor 204 can be a WFM deposited over the gate dielectric 202 by a suitable deposition process, for example, CVD, PECVD, PVD, plating, thermal or e-beam evaporation, and sputtering. The type of WFM depends on the type of transistor and can differ between the nFET and pFET devices. P-type WFMs include compositions such as ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The gate conductor 204 can further include a tungsten (W), titanium (Ti), aluminum (Al), cobalt (Co), or nickel (Ni) material over the WFM layer of the gate conductor 204. The gate conductor 204 can be deposited by a suitable deposition process, for example, CVD, PECVD, PVD, plating, thermal or e-beam evaporation, and sputtering.

Figure 3:
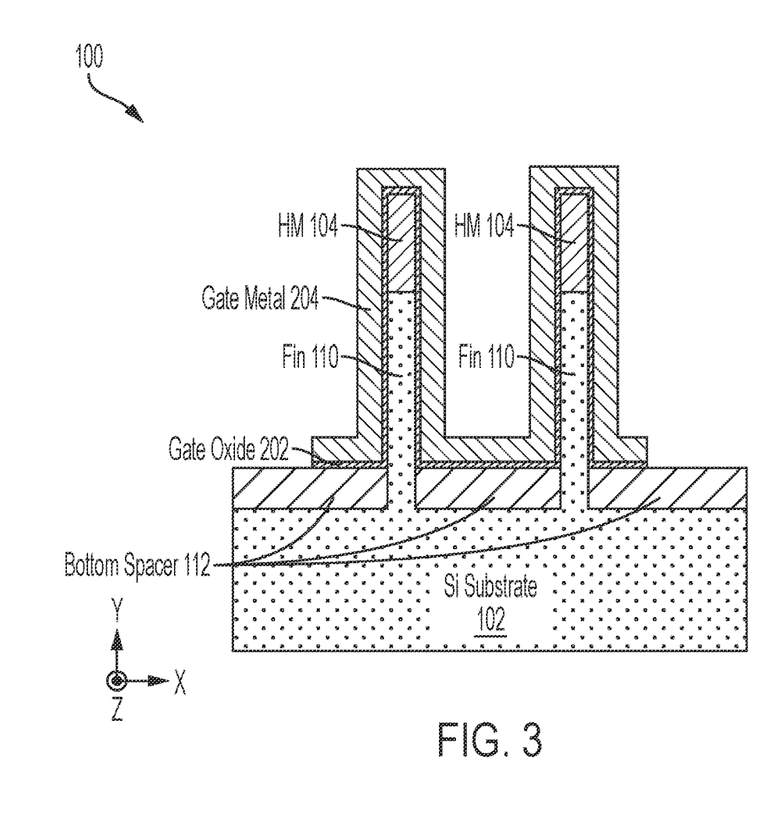
FIG. 3 depicts a cross-sectional view of the semiconductor structure after fabrication operations according to embodiments of the invention.

In FIG. 3, known semiconductor fabrication operations have been used to etch portions of the gate metal/conductor 204 and the gate dielectric 202 to expose portions of top surfaces of the bottom spacers 112. In embodiments of the invention, any of the known suitable processes for etching metals/conductors can be used, followed by any of the known suitable processes for etching dielectric material. In embodiments of the invention, the portions of the gate metal/conductor 204 and the gate dielectric material 202 that are not intended to be etched will be protected, for example by using a mask (not shown).

Figure 4:
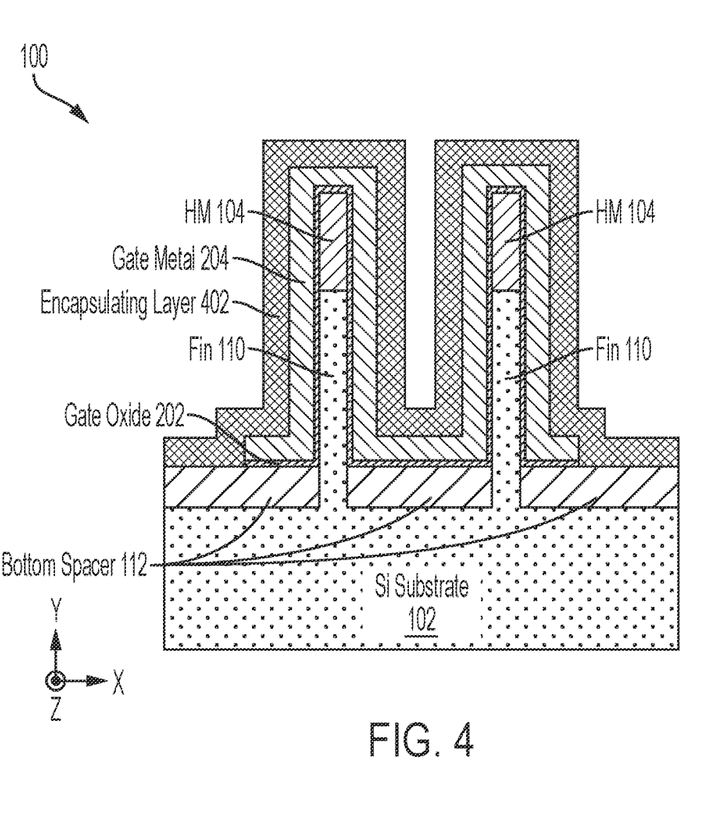
FIG. 4 depicts a cross-sectional view of the semiconductor structure after fabrication operations according to embodiments of the invention.

In FIG. 4, known semiconductor fabrication operations have been used to deposit a gate encapsulating layer 402 over the semiconductor structure 100, including specifically over portions of the bottom spacers 112 and the gate conductor/metal 204. In embodiments of the invention, the encapsulating layer 402 can be formed from any suitable material, including, for example, a dielectric material. In some embodiments of the invention, the encapsulating layer 402 can be a dielectric material that can be selectively etched or otherwise removed with respect to other dielectric materials of the semiconductor structure 100 (e.g., interlayer dielectric (ILD) 502 (shown in FIG. 5)). The encapsulating layer 402 can be deposited using known deposition processes, such as, for example, CVD, PECVD, ALD, PVD, chemical solution deposition, other directional deposition techniques, or other like processes.

Figure 5:
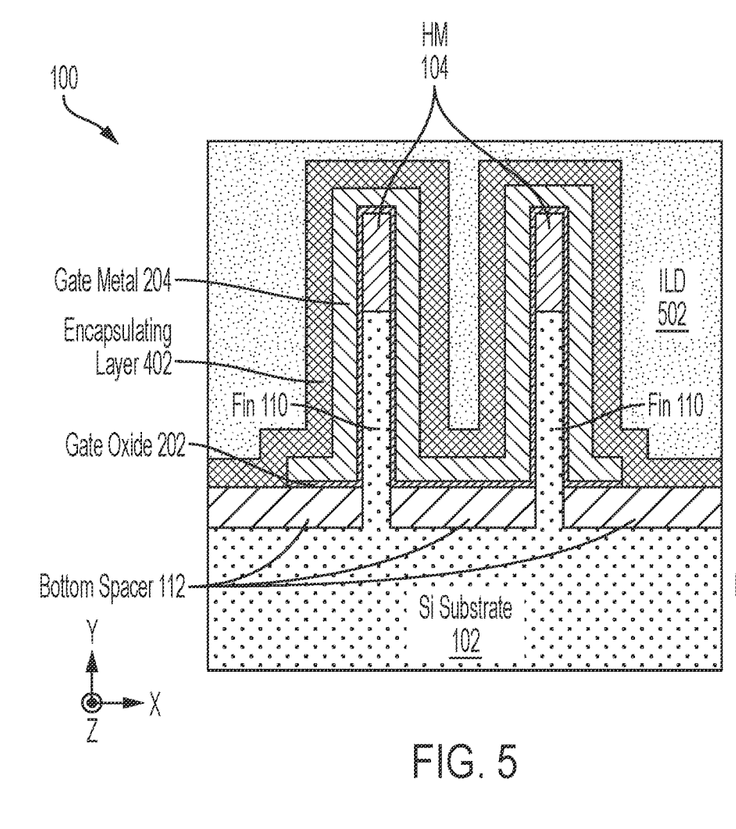
FIG. 5 depicts a cross-sectional view of the semiconductor structure after fabrication operations according to embodiments of the invention.

In FIG. 5, known semiconductor device fabrication processes have been used to deposit an ILD 502 to fill in remaining open spaces of the semiconductor structure 100 and stabilize the structure 100. In aspects of the invention, the deposited ILD regions 502 can be formed from a low-k dielectric (e.g., k less than about 4) and/or an ultra-low-k (ULK) dielectric (e.g., k less than about 2.5).

Figure 6:
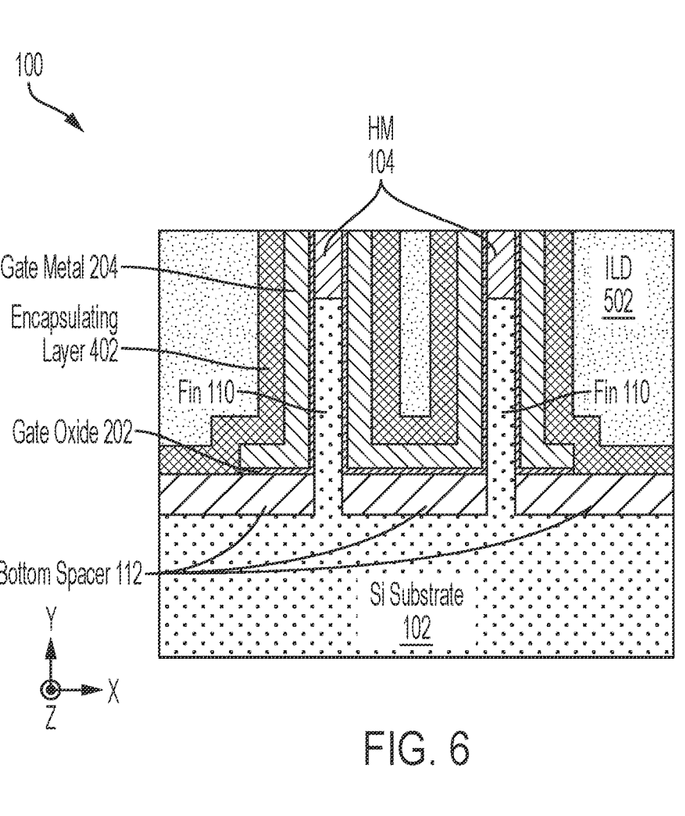
FIG. 6 depicts a cross-sectional view of the semiconductor structure after fabrication operations according to embodiments of the invention.

In FIG. 6, known semiconductor device fabrication processes have been used to planarize the structure 100 to a predetermined level that removes portions of the hard masks 106, the gate dielectric 202, the gate conductor/metal 204, the encapsulating layer 402, and the ILD 502. In embodiments of the invention, the planarization operation can be performed using a chemical mechanical planarization (CMP) process.

Figure 7:
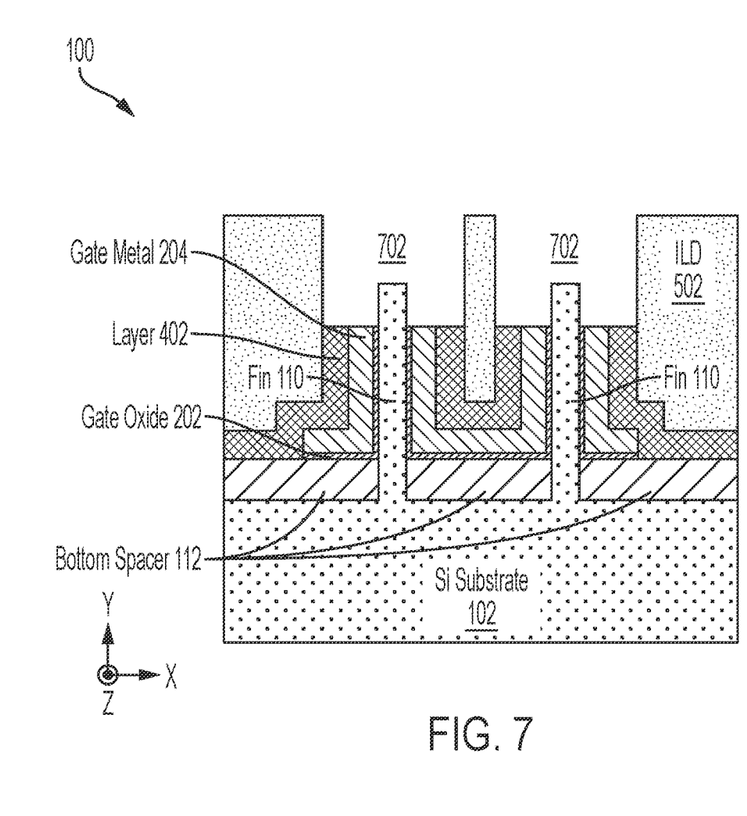
FIG. 7 depicts a cross-sectional view of the semiconductor structure after fabrication operations according to embodiments of the invention.

In FIG. 7, known semiconductor device fabrication processes have been used to recess and remove remaining portions of the hard masks 104 (shown in FIG. 6). Additionally, known semiconductor device fabrication processes have been used to recess the gate dielectric 202, the gate conductor/metal 204, and the encapsulating layer 402, thereby forming trenches 702 and exposing upper regions of the fins 110. Each trench 702 includes a substantially U-shaped bottom region that extends around a circumference of upper regions of the fins 110.

Figure 8:
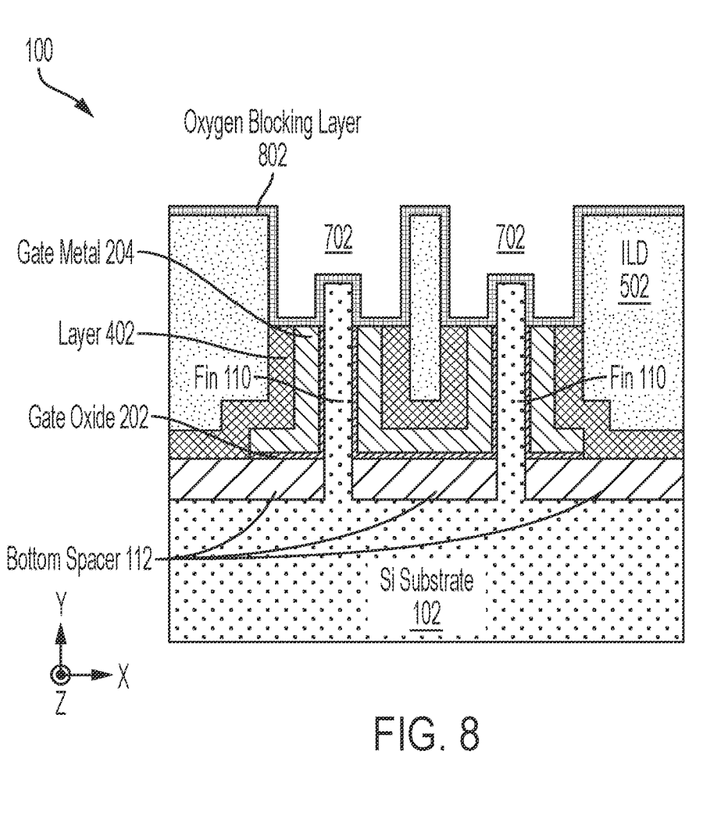
FIG. 8 depicts a cross-sectional view of the semiconductor structure after fabrication operations according to embodiments of the invention.

In FIG. 8, known semiconductor device fabrication processes have been used to conformally deposit an oxygen-blocking layer 802 over the semiconductor structure 100, including specifically within the trenches 702. In embodiments of the invention, the oxygen-blocking layer 802 can be deposited using any suitable conformal deposition technique, including, for example, atomic layer deposition (ALD). In embodiments of the invention, the oxygen-blocking layer 802 can be formed from an oxygen gathering or "gettering" material. In general, a "gettering" or "getter" material is a reactive material that exhibits the property of "getting" or scavenging another material. For example, an oxygen getter material exhibits the property of combining with nearby oxygen molecules chemically or by absorption, which removes oxygen from either the environment or from another material to which the oxygen getter material is communicatively coupled. Aluminum (Al) is an example of an oxygen gettering material because Al is effective at gettering (i.e., reacting with and removing) oxygen that is present in either the environment or another material to which the Al is communicatively coupled. In embodiments of the invention, the oxygen-blocking layer 802 can be formed from an Al containing material, including, but not limited to aluminum monoxide (AlO), aluminum monocarbide (AlC), and the like. In some embodiments of the invention, the oxygen gettering material can include silicon (Si), germanium (Ge), Si-rich SiOx, and Ge-rich GeOx. In embodiments of the invention, the Si-rich or Ge-rich material has sufficient excess Si or Ge to performing gettering functions on oxygen that is present in either the environment or another material to which the Si-rich or Ge-rich material is communicatively coupled. The thickness of the oxygen-blocking layer 802 can range from about 0.5 nm to about 2 nm, although other thicknesses are also contemplated.

Figure 9:
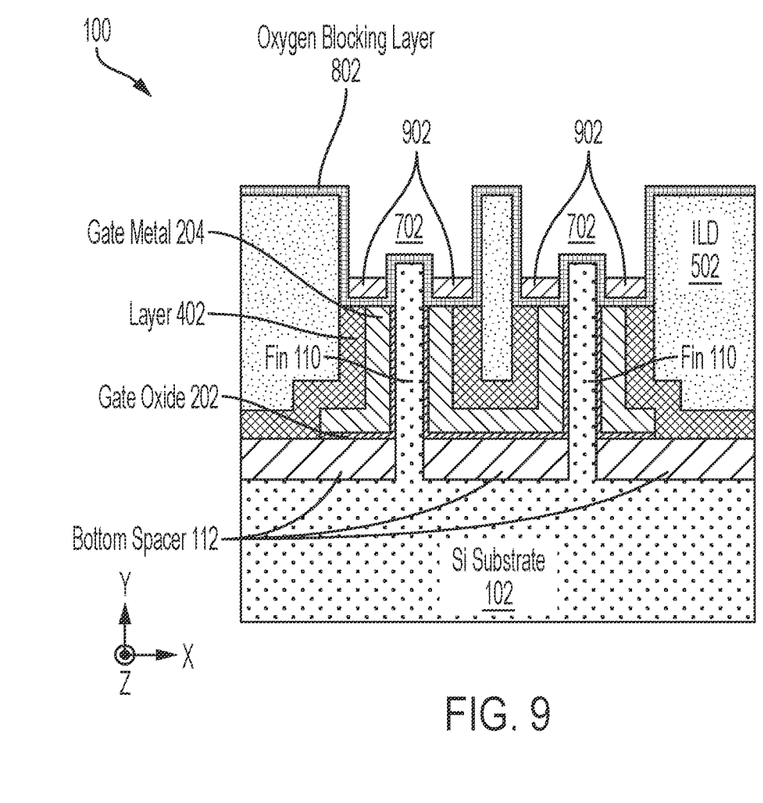
FIG. 9 depicts a cross-sectional view of the semiconductor structure after fabrication operations according to embodiments of the invention.

In FIG. 9, known semiconductor fabrication processes have been used to form top spacers 902 within the substantially U-shaped bottom regions of the trenches 702 and over portions of the oxygen-blocking layer 802 that are within the substantially U-shaped regions of the trenches 702. The top spacers 902 can be formed from and/or include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The top spacers 902 can be formed using known deposition processes, such as, for example, CVD, PECVD, ALD, PVD, chemical solution deposition, other directional deposition techniques, or other like processes. In embodiments of the invention, the top spacers 902 can be deposited to include an overburden then etched back to a desired level. In some embodiments of the invention, the desired level is below top surfaces of the fins 110, thereby leaving exposed a top surface and portions of the sidewalls of each of the fins 110.

The deposition process used to form the top spacers 902 exposes the semiconductor structure 100 to oxygen that is present in a chamber used to execute a variety of deposition processes, including, for example, CVD, PECVD, ALD, PVD, chemical solution deposition, other directional deposition techniques, or other like processes. In accordance with aspects of the invention, the oxygen-blocking layer 802 blocks oxygen used in the above-described deposition processes from reaching the semiconductor structure 100, and more specifically from reaching the portions of the fins 110 that were exposed after the fabrication operations described in connection with FIG. 7. Accordingly, embodiments of the invention prevent oxygen from contacting and reacting with the fins 110 to form an oxide of the channel fin material. In embodiments of the invention where the fins 110 include Si, embodiments of the invention prevent oxygen from contacting and reacting with Si of the fins 110 to form a silicon oxide layer on the fins 110. In embodiments of the invention where the gate dielectric/oxide 202 that was removed from the fins 110 during the recess operations depicted in FIG. 7 includes a layer of $SiO_2$, embodiments of the invention prevent oxygen from contacting and reacting with Si of the fins 110 to regrow on the fins 110 the $SiO_2$ layer that was removed when the gate dielectric 202 was recessed from upper regions of the fins 110. Without benefit of aspects of the invention, growth of an oxide material (e.g. a silicon oxide material) on the fins 110 would negatively impact inversion layer thickness ($T_{inv}$) at the interface between the gate dielectric/oxide 202 and the fins 110. Reducing $T_{inv}$ assists with achieving desired performance characteristics in conventional VFET designs.

Figure 10:
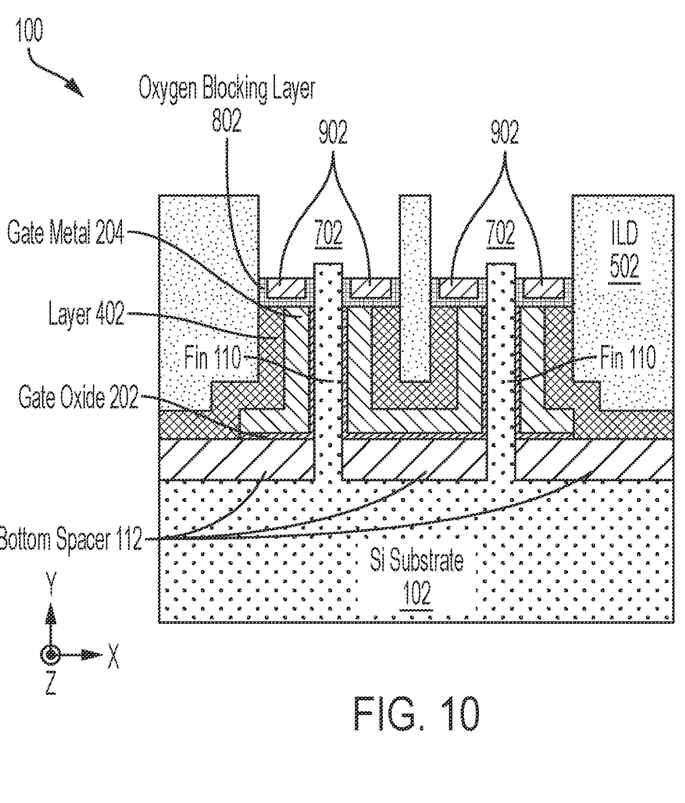
FIG. 10 depicts a cross-sectional view of the semiconductor structure after fabrication operations according to embodiments of the invention.

In FIG. 10, known semiconductor fabrication processes (e.g., a directional etch) have been used to remove the oxygen-blocking layers 802 from everywhere on semiconductor structure 100 except sidewalls and bottom surfaces of the top spacers 902, thereby forming oxygen-blocking spacers configured to include the top spacers 902 and the substantially U-shaped remaining portions of the oxygen-blocking layers 802.

Figure 11:
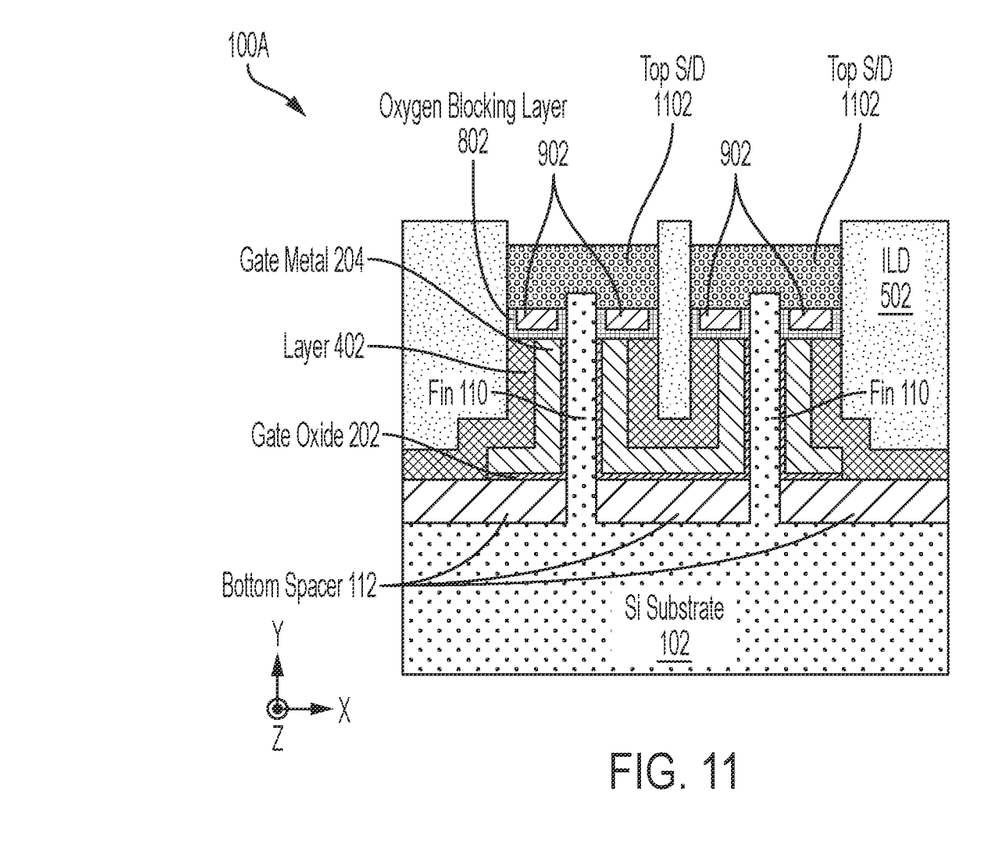
FIG. 11 depicts a cross-sectional view of the semiconductor device after fabrication operations to form the semiconductor structure into a final VFET semiconductor device having an oxygen-blocking top spacer that prevents oxygen diffusion into the VFET channel in accordance with embodiments of the invention.

In FIG. 11, known fabrication operations have been used to form top S/D regions 1102 on the top surfaces and exposed sidewalls of the fins 110. In embodiments of the invention, the top S/D regions 1102 are epitaxially grown, and the necessary doping to form the top S/D regions 1102 is provided through in-situ doping during the epitaxial growth process. The top S/D regions 1102 can be doped by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

After the fabrication operations depicted in FIG. 11 have been completed, a pair of VFET structures 100A has been formed, wherein the VFETs in the pair of VFET structures 100A are connected to one another in series and share portions of the encapsulating layer 402, the gate conductor/metal 204, the gate dielectric 202, and a bottom spacer 112. In downstream processing, known fabrication operations are used to deposit an additional ILD material (not shown), and S/D contacts (not shown) are formed in the ILD material to contact the top S/D regions 1102. In embodiments of the invention, the S/D contacts can be formed by forming a trench in the additional ILD material. The trench is positioned over the top S/D regions 1102 to which electrical coupling will be made. A liner/barrier material (not shown) is deposited within the trench, and the remaining trench volume is filled with copper (not shown) using, for example, a chemical/electroplating process, to thereby form the S/D contact. The excess copper is removed to form a flat surface for subsequent processing. A cap layer (not shown) can be deposited over the exposed top surface of the S/D contact.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   a channel fin;
   a trench adjacent to an upper region of the channel fin; and
   an oxygen-blocking layer within the trench;
   wherein the oxygen-blocking layer comprises an oxygen gettering material configured to remove, through chemical combination, oxygen from an environment to which the oxygen-blocking layer is exposed.

2. The device of claim 1 further comprising a top spacer within the trench.

3. The device of claim 2, wherein:
the top spacer is over a central portion of the oxygen-blocking layer; and
a sidewall portion of the oxygen-blocking layer is between the top spacer and a sidewall of the upper region of the channel fin.

4. The device of claim 2, wherein the trench includes a substantially U-shaped bottom region.

5. The device of claim 4, wherein the oxygen blocking layer is in a first portion of the substantially U-shaped bottom region.

6. The device of claim 5, wherein the top spacer is in a second portion of the substantially U-shaped bottom region.

7. The device of claim 1, wherein the chemical combination comprises the oxygen-blocking layer chemically combining with the oxygen.

8. The device of claim 1, wherein the oxygen gettering material comprises an aluminum (Al) containing material.

9. The device of claim 8, wherein the Al containing material comprises aluminum monoxide (AlO) or aluminum monocarbide (AlC).

10. A semiconductor device comprising:
a channel fin over a substrate;
a trench adjacent to an upper region of the channel fin;
an oxygen-blocking layer within a first portion of the trench; and
a doped source or drain (S/D) region within a second portion of the trench;
wherein the oxygen-blocking layer comprises an oxygen gettering material configured to remove, through absorption or chemical combination, oxygen from an environment to which the oxygen-blocking layer is exposed.

11. The device of claim 10 further comprising a top spacer within a third potion of the trench.

12. The device of claim 11, wherein the top spacer is over a central portion of the oxygen-blocking layer.

13. The device of claim 12, wherein a sidewall portion of the oxygen-blocking layer is between the top spacer and a sidewall of the upper region of the channel fin.

14. The device of claim 13, wherein;
the sidewall portion of the oxygen-blocking layer is coupled to the sidewall of the upper region of the channel fin; and
the oxygen gettering material is further configured to remove oxygen from an element of the semiconductor device to which the oxygen-blocking layer is coupled.

15. The device of claim 11, wherein:
the trench includes a substantially U-shaped bottom region;
the oxygen blocking layer is in the substantially U-shaped bottom region; and
the top spacer is in the substantially U-shaped bottom region.

16. The device of claim 10, wherein the chemical combination comprises the oxygen gettering material of the oxygen-blocking layer configured to remove the oxygen by chemically combining with the oxygen.

17. The device of claim 10, wherein the absorption comprises the oxygen gettering material of the oxygen-blocking layer configured to remove the oxygen by absorbing the oxygen.

18. The device of claim 10, wherein the oxygen gettering material comprises an aluminum (Al) containing material.

19. The device of claim 18, wherein the Al containing material comprises aluminum monoxide (AlO) or aluminum monocarbide (AlC).

20. A semiconductor device comprising:
a channel fin;
a trench adjacent to an upper region of the channel fin; and
an oxygen-blocking layer within the trench;
wherein the oxygen-blocking layer comprises an oxygen gettering material configured to remove, through absorption, oxygen from an environment to which the oxygen-blocking layer is exposed.

* * * * *